Oct. 8, 1957 W. M. HANCOCK 2,808,587

ELECTRICAL COMPONENT MOUNTING APPARATUS

Filed Dec. 13, 1956 4 Sheets-Sheet 1

INVENTOR
W. M. HANCOCK
BY W. A. Johnson
ATTORNEY

Oct. 8, 1957 W. M. HANCOCK 2,808,587

ELECTRICAL COMPONENT MOUNTING APPARATUS

Filed Dec. 13, 1956 4 Sheets-Sheet 2

INVENTOR
W. M. HANCOCK
BY W. A. Johnson
ATTORNEY

Oct. 8, 1957 W. M. HANCOCK 2,808,587

ELECTRICAL COMPONENT MOUNTING APPARATUS

Filed Dec. 13, 1956 4 Sheets-Sheet 3

INVENTOR
W. M. HANCOCK
BY W. A. Johnson
ATTORNEY

Oct. 8, 1957 W. M. HANCOCK 2,808,587

ELECTRICAL COMPONENT MOUNTING APPARATUS

Filed Dec. 13, 1956 4 Sheets-Sheet 4

INVENTOR
W. M. HANCOCK
BY
W. L. Johnson
ATTORNEY

United States Patent Office 2,808,587

Patented Oct. 8, 1957

2,808,587

ELECTRICAL COMPONENT MOUNTING APPARATUS

William M. Hancock, Groveland, Mass., assignor to Western Electric Company, Incorporated, New York, N. Y., a corporation of New York Application December 13, 1956, Serial No. 628,131

13 Claims. (Cl. 1—2)

This application is a continuation in part of my co-pending application, Serial No. 573,005, filed March 21, 1956, and relates to apparatus for mounting electrical components, particularly apparatus for attaching lead wires of electrical components such as resistors and capacitors to wiring boards.

Wiring boards are board-like panels, formed of suitable dielectric material, having electrical circuits printed on or otherwise applied to the surface thereof and provided with apertures for the connection of leads of electrical components, such as resistors or capacitors, in the electrical circuits. One of the assembly problems has been to devise a suitable way of mounting the electrical components and forming the electrical connections between the leads of the components and the wiring on the boards.

The object of the present invention is an apparatus which is simple in structure, automatic in action and highly efficient in forming and securing leads of electrical components to wiring boards.

The claimed subject matter of the parent application broadly includes a support for an apertured board, a holder for a component, having leads extending in opposite directions therefrom, and means actuable to trim the leads, form them and move them through apertures of a wiring board.

Broadly, the subject matter of this invention, according to the object is the automatic forming and securing of component leads to wiring boards. Specifically, elements supported for rocking movement about their axes have eccentrically positioned apertures wherein compressible pins are disposed to enter the apertures of the board to initially position the board for the leads of a component. The second function of the compressible pins is to close switches in an operating circuit to cause rocking movement of the elements. The switches are in series and, if either lead is of insufficient length to close its switch, the element rocking means will not be operated. The apertures of the elements are of sufficient size, larger in diameter than the leads and with rounded outer ends to form double bends in the leads to cause positive contact thereof with their respective conductors of the wiring board.

Other objects and advantages will be apparent from the following detailed description when considered in conjunction with the accompanying drawings, wherein.

Figure 1:
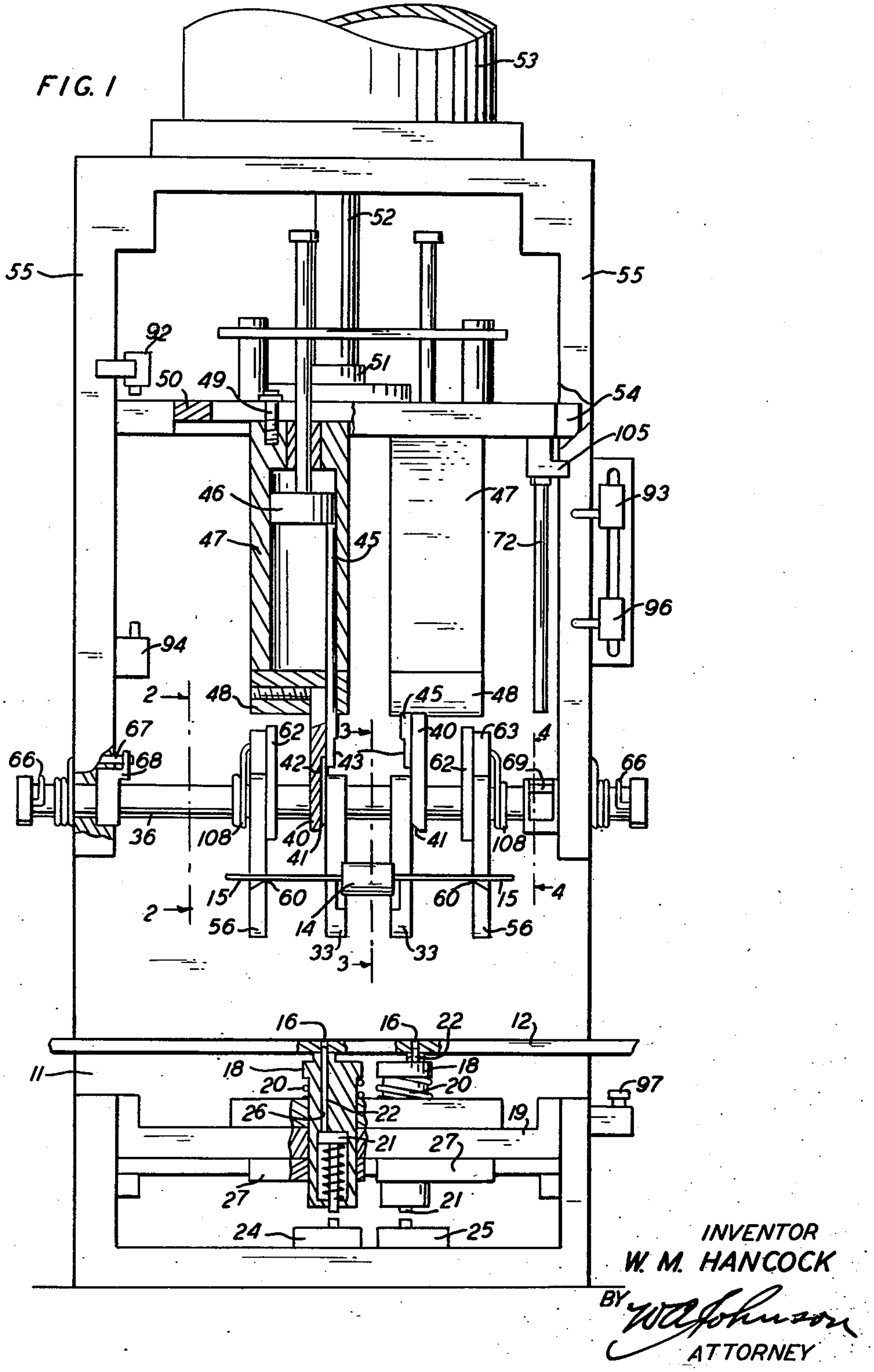
Fig. 1 is a front elevational view of the apparatus shown in open or unoperated position, portions thereof being shown in section.

The apparatus as shown in Fig. 1 includes a main frame 11 having a support (not shown) for an apertured wiring board 12. Electrical components 14 such as resistors or capacitors are to be incorporated in certain of the electrical circuits, represented by the printed wires 13 of the wiring board 12, by cutting leads 15 of each component to predetermined lengths, formed downwardly extending right angle bends in the leads and forcing the leading ends of the leads through any desired pair of apertures 16 in the board 12. The printed wires around the apertures have large circular portions 17. The apertures 16 are formed in pairs at positions where it may be desired to include electrical components in the electrical circuits and are located adjacent the conductive wire lines to which the leads are to form electrical connections so that when their ends are clinched as shown in Figs. 7 to 12 inclusive, the bent portions of the leads 15 will firmly engage the adjacent circular conductive portions 17 of the board.

Clinching elements or anvils 18 are rockably disposed in bearing like apertures of a lateral portion 19 of the frame 10 and are normally urged about their axes into their starting or receiving positions by suitable means (not shown). The helical springs 20 normally hold the clinching elements 18 in their top receiving positions and act as cushions to permit downward movement of the elements during their rocking movements to clinch the leads. Each element is provided with spring-pressed plungers 21 which perform two functions; one, to hold their respective compressible locating pins 22 upwardly to be received in the apertures 16 of the board 12, and two, to actuate their respective micro-switches 24 and 25 when the pins have been compressed by the lead wires 15. The switches 24—25 may be adjusted vertically in any desired manner, to vary the lengths of the lead portions to be clinched. The pins 22 are disposed in eccentrically disposed apertures 26 normally positioned by the springs 20 to locate a selected pair of apertures 16 of the board 12 in alignment with the formed leads 15 of a component so that when the components with the formed leads are moved downwardly, they will pass through the apertures 16 depressing the pins 22 and the plungers 21 to actuate the micro-switches 24 and 25. The elements 18 have cams 27 (Figs. 1 and 6) fixed thereto and positioned to engage a slide 28 actuated by an air cylinder shown only at 29 in Fig. 13. A piston rod 30 of the air cylinder is connected to the slide to move the slide and thereby actuate the cams 27 to rock the elements 18 about their axes to clinch the ends of the leads 15 against the undersurface and the respective conductive portions 17 of the wiring board 12. Although the clinching elements or anvils 18 are, in the present instance, rocked about axes to bring about the clinching operations, they are mounted so that they will be moved laterally toward each other. If desired, they may be mounted on laterally movable slides. It may appear, from viewing Fig. 7, that movement of the clinching elements relative to the wiring board 12 would cause shearing of the leads 15, but this is not so. In the present instance the wiring board 12 is supported in the plane shown and the springs 20 permit downward movement of the elements 18 (Figs. 8 and 9) to make possible the clinching of the leads.

Each component 14 is supported by its leads 15 resting on a holder 33 which, in reality, is composed of a pair of arms having recesses 34 in their inner surfaces to allow sufficient space for components of various sizes to be positioned with respect to the selected apertures 16 disposed in the operating or receiving position by the pins 22 of the clinching elements 18. The arms 33 are mounted upon and keyed to a shaft 36 for positioning relative to each other upon the shaft depending upon the size of the component 14. The arms 33 may be secured in position on the shaft by set screws. Forming members 40 have tapered ends 41 and vertical grooves 42 to cooperate with the arms 33 to bend the leads downwardly at right angles and into alignment with the apertures 16. Reduced ends 43 of push rods 45 are positioned to slide longitudinally of the forming members 40 by the actuation of their connected pistons 46 in air cylinders 47 to cooperate with the arms 33 to clamp and firmly hold the leads 15. The lower ends 48 of the air cylinders are apertured to receive the members 40 and the rods 45. The air cylinders 47 are supported for lateral adjustment at 49 relative to each other by a head 50, which is mounted at 51 on the lower end of a piston rod 52 of an air cylinder 53 and has projections 54 positioned for vertical guided movements in channel portions 55 of the frame 10. The air cylinder 53 is mounted upon the upper end of the frame 10 and normally holds the head 50 with the air cylinders 47 in the positions shown in Fig. 1.

Figure 2:
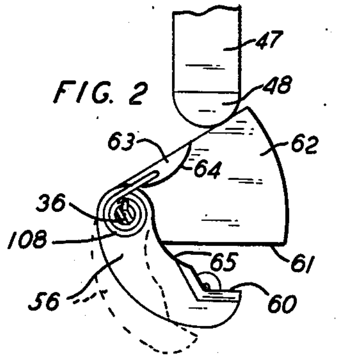
Fig. 2 is a fragmentary sectional view of one of the cutting units taken along the line 2—2 of Fig. 1.
Figure 3:
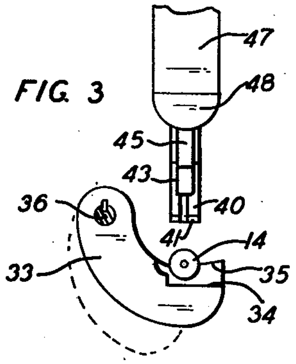
Fig. 3 is a fragmentary sectional view taken along the line 3—3 of Fig. 1.
Figure 4:
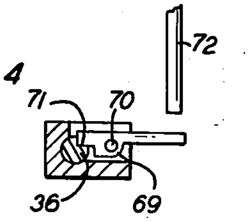
Fig. 4 is a fragmentary sectional view taken along the line 4—4 of Fig. 1.
Figure 12:
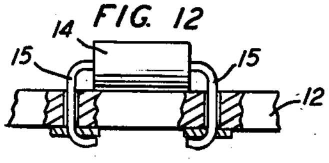
Fig. 12 is a fragmentary vertical sectional view of the wiring board illustrating an article with its leads clinched.

Cutting units include jaws 56, mounted on the shaft 36 and keyed thereto so that they may be moved on the shaft relative to the forming members 40 and the arms 33 depending upon the positions where the lead wires 15 are to be cut. The cutting jaws 56 are of the contours shown in Figs. 1 and 2 with angularly shaped cutting edges 60 to cooperate with cutting edges 61 of cutting members 62 which are also mounted on the shaft 36 but free to rotate thereon. The cutting units are similar in structure yet one may be defined as a left hand unit and the other as a right hand unit in that the bevelled portions of the cutting edges 60 taper inwardly and upwardly to the inner surfaces of the jaws 56, and the cutting members 62 are mounted on the inner sides of the jaws in the paths of their respective curved lower ends 48 of their air cylinders 47. The members 62 have projections 63 on their outer surfaces formed with arcuate surfaces 64 to engage arcuate surfaces 65 of their cutting jaws 56 to rock the jaws 56 and thereby rock the shaft 36 to move the arms 33 out of the normal holding position shown in Figs. 1 and 3 against the forces of springs 66. The springs 66 mounted on the outer ends of the shaft 36, function to rock the shaft counterclockwise (looking from the left Fig. 1) into its normal position after the component has been moved into its position adjacent the board and the ends 48 of the cylinders have moved upwardly to release the cutter members 62. A stop 67, fixed to the portion 55 of the frame 10, when engaged by a finger 68, fixed to the shaft 36, locates the shaft in its normal position. During the interval the arms 33 are moved away from the component, the ends 43 of the rods 45 are away from the lead wires and the lead wires are frictionally held in the grooves 42 of the forming members 40. The push rods 43—45, during this interval, move downwardly again to push the leads through the apertures of the board 12. A latch 69 (Figs. 1 and 4) supported on a fixed pivot 70 normally enters a recess 71 in the shaft 36 to hold the shaft against clockwise movement of the shaft during the cutting and forming operations. The latch 69 has a projection (Fig. 4) to be engaged by a rod 72 (Figs. 1 and 4) fixed to the head 50 and movable therewith to release the latch just prior to the means 63—65 (Fig. 2) being effective to rock the shaft clockwise.

Figure 6:
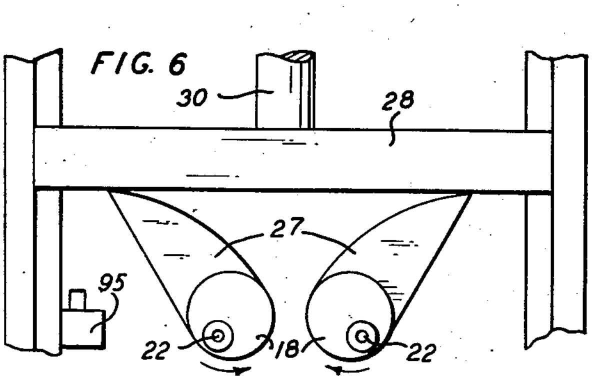
Fig. 6 is a fragmentary detailed view illustrating the rocking mechanism for the clinched elements.
Figure 13:
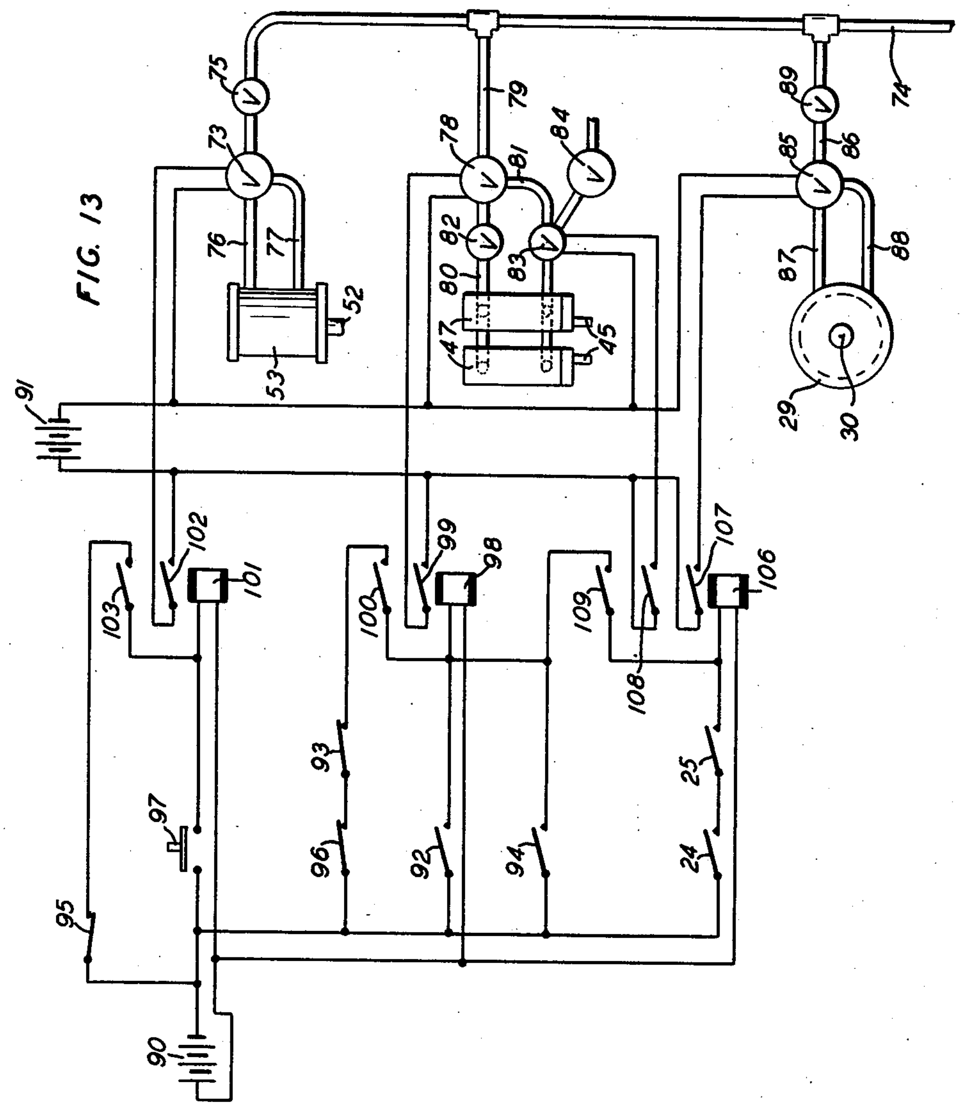
Fig. 13 is a schematic illustration of the electro-pneumatic control means for the apparatus.

The electro-penumatic control means for the apparatus is shown in Figs. 1, 6 and 13. The main cylinder 53 (Figs. 1 and 13) in the present illustration is under the control of an electro-magnetic valve 73 normally positioned to cause the piston of the air cylinder 53 to return to its upper position. A main supply line 74 directs fluid, such as air under pressure, through a flow control valve 75, valve 73 and fluid lines 76 or 77 extending from the valve 73 to the top and bottom parts of the air cylinder 53.

The twin air cylinders 47 are mainly under the control of an electro-magnetic valve 78 receiving air under pressure from the main supply line 74 through line 79 and connected to the top and bottom parts of the air cylinders 47 through lines 80 and 81, respectively. A flow control valve 82 is placed in line 81 to control the movement of the pistons 46 and in cylinders 47 to control the movements of the push rods 45. Another electro-magnetic valve 83 (having an associated flow control relief valve 84, is connected into line 81 to stop downward movement of the pistons 46 and rods 45 for actuation of clinching elements. The normal position of the valve 83 leaves the line 81 open for directing air under pressure to the bottom of the pistons or to exhaust air therefrom depending on the position of valve 78. However, when the lead wires 15 are moved downwardly a predetermined distance to cause closing of switches 24 and 25 (Figs. 1 and 13) the valve 83 will be energized to close exhausting of air through line 81 and thereby stop downward movements of the rods 43—45 and the component and lead wires 15.

The air cylinder 29 with its piston rod 30 (Figs. 6 and 13) is under the control of an electro-magnetic valve 85 normally positioned to cause the air cylinder to hold the slide 28 in the position shown in Fig. 6. The valve 85 receives air under pressure from the supply line 74 through line 86 and directs the air under pressure selectively through lines 87 and 88 to different ends of the cylinder 29. A flow control valve 89 is disposed in line 86.

The electrical circuits include, in the present instance, two sources of electrical energy 90 and 91. In the present embodiment of the invention, there are seven microswitches 92, 93, 94, 95, 96, 24 and 25 and a hand switch 97. Switches 92, 93, 94, 96, 24 and 25 are shown in Figs. 1 and 13 while the switch 95 is shown in Figs. 6 and 13.

The apparatus, as shown in Fig. 1, is about to complete one cycle of operation and automatically operate the pistons 46 with their rods 43—45 down to clamp the leads of the next component on the arms 33 during the first part of the next operating cycle. This occurs by closing switch 92 at the end of the upstroke of the head 50 and piston rod 52. When the normally open switch 92 is closed, relay 98 is energized to close its contacts 99 and 100. Contact 99, when closed, completes a circuit through electro-magnetic valve 78 to operate the valve to connect fluid lines 79 and 80 and cause pistons 46 and their rods to move down under a predetermined pressure controlled by valve 82. This pressure provides a predetermined holding force back of the rods 43—45 to firmly, but not damagingly, clamp the leads on the arms 33. The contact 100, when closed, completes a circuit through normally closed switches 96, 93 and relay 98 to hold the relay energized.

The operating cycle of the apparatus begins with the manual closing of hand switch 97 after a component 14 is positioned with its leads 15 resting on the arms 33 and the board 12 is moved to locate the desired pair of holes 16 in the operating or loading position. The hand switch 97, when closed, causes energization of relay 101 to close its contacts 102 and 103. Contact 103, when closed, completes a circuit for relay 101 through normally closed micro-switch 95 to hold the relay energized. Contact 102, when closed, completes a circuit through valve 73, operating the valve to cause the flow of air under pressure to the top of the main cylinder 53 to cause its piston rod 52 to move downwardly.

The first motion of the operating cycle is the downward movement of the head 50 by the piston rod 52, moving the cylinders 47 to bring about a series of successive actions, (1) holding the previously lowered rods 43—45 downwardly in engagement with the leads 15 of the component 14 to hold them clamped on the arms 33, (2) cause the lower ends 48 of the cylinders 47 to engage and move the cutter members 62 (Fig. 2) a distance, relative to the cutting jaws 56 to cut excess lengths from the leads 15, (3) move the forming members 40 downwardly, with the cylinders 47, to cause them to cooperate with the arms 33 to form right angle bends in the leads 15 and to hold the downwardly extending portions of the bent leads in the grooves 42 of the forming members, (4) after upward movement of the head 50 will cause rod 72 (Figs. 1 and 4) to release latch 69 from recess 71 in shaft 36, (5) by this time, surface 64 (Fig. 2) of members 63 of cutting members 62 engage cutting jaws 56 to rock them with the shaft 36 to move the arms 33 clockwise against the forces of springs 66 out of the operating area of the apparatus, leaving the component frictionally held, through its bent leads in the grooves of the forming members, (6) the downward motion, originating with the cylinder 53 stops with the forming members adjacent the board 12, (7) the push rods 43—45 are moved downwardly again to engage the leads 15 adjacent the bends therein and push them downwardly, while guided by the grooves 42 in the forming members 40 until the leading ends of the leads pass through the aligned apertures 16 in the board 12 and into the apertures 25 of the clinching elements 18, distances sufficient to actuate their operating switches 24—25. This completes the mechanical actions during one-half the operating cycle, but other electrical and pneumatic actions occur to bring about these mechanical actions.

At the start of the downward mechanical motion, switch 92 is released and allowed to open. Relay 98 remains operated through its closed contact 100 until normally closed switch 93 (Figs. 1 and 13) is momentarily opened by projection 105, moving with the head 50. De-energization of relay 98 results in de-energization of valve 78 after mechanical action (3), the forming of the cut leads 15, to cause the rods 43—45 with their pistons to move upwardly. The moment of this action may be varied by varying the position of switch 93 (Fig. 1) relative to the starting position of projection 105. Following this interval, mechanical action (4), rocking of shaft 36 and arms 33, takes place.

At the completion of the downward movement of the head 50 and the parts carried thereby, normally opened switch 94 is closed and held closed to complete another circuit through relay 98. This results in closing of contacts 99 and 100, energization of valve 78 and downward movement of rods 43—45 to push the bent leads to their downward limit through apertures 16 in the board 12 and to operate switches 24—25. The first downward movement of the rods 43—45 takes place as the head 50, the cylinders 47 and the rods leave their uppermost positions to allow switch 92 to open. The rods 43—45 move downwardly to hold the leads 15 on the fingers 33. After the leads are cut and formed, switch 93 is opened to cause the rods 43—45 to move upwardly. After the fingers 33 and the cutters 56 are rocked about the axis of shaft 36, leaving the component supported by the lead wires frictionally held in the grooves 42 of the forming members 40, the switch 94 is closed to cause the rods 43—45 to move downwardly again relative to their cylinders. At this time, the cylinders 47 are in their down positions adapting the rods to move downwardly sufficiently to force the leads 15 into the apertures 26 of the elements 18 to move the pins 22 and the plungers 21 downwardly to operate the switches 24—25.

The functions of the switches 24—25 when closed are to cause stopping of the downward movement of the rods 43—45 to control the lengths of the leads to be clinched and to cause operation of the clinching elements 18. This is brought about by energization of relay 106 and closing of its contacts 107, 108 and 109. Contact 109, when closed, completes a circuit from one side of battery 90 through closed switch 94, closed contact 109, relay 106 to the other side of battery 90, to hold relay 106 operated when switches 24—25 are released. Contact 108, when closed, completes a circuit through battery 91 to operate valve 83 to stop downward movements of pistons 46, rods 43—45 and the leads 15 in the clinching elements 18. Contact 107, when closed, completes a circuit to operate valve 85 to operate cylinder 29 to move piston rod 30 (Figs. 6 and 13) to actuate cams 27 to rock clinching elements 18 to clinch the ends of the leads against the undersurface of the board 12 to electrically include leads of the component 14 in a circuit of the board.

At the completion of the mechanical actions during the first half of the operating cycle, one of the cams 27 of the clinching units 18 (Fig. 6) will open switch 95 to de-energize relay 101 and valve 73 to cause piston of cylinder 53 to return head 50 and cylinders 47 to their starting positions. As the head 50 moves upwardly, projection 105, or other suitable means, operates switch 96 temporarily open to de-energize relay 98 and valve 78, and switch 94 is opened to de-energize relay 106 and valves 83 and 85. Rods 43—45 and with their pistons 46 and cams 27 with their clinching members return to their normal positions. Switches 93 and 96 are adapted with elbow-like arms to be actuated only during certain directional movements of the head 50 and the projection 105. When the head 50 reaches its normal top position, switch 92 is closed to energize relay 98 and valve 78 to raise the rods 43—45 to their starting positions.

Figure 5:
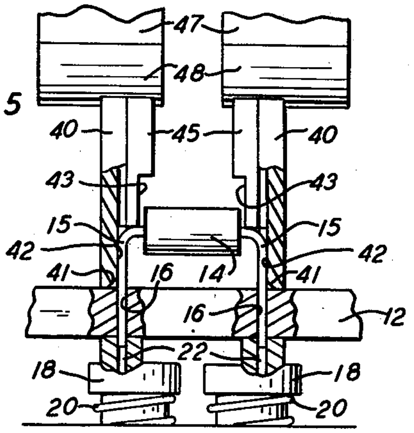
Fig. 5 is a fragmentary detailed view illustrating the end of the stroke of the forming members after having inserted the ends of the leads through the apertures of the wiring board and into the apertures of the clinching elements.

In Figs. 1 and 5 the leads 15, the apertures 16 of the wiring board 12 and the pins 22 and apertures 26 of the elements or anvils 18, appear to be of substantially equal diameters, but in practice the different parts are preferably contoured as shown in the enlarged fragmentary views in Figs. 7, 8, 9 and 10. In these figures, the aperture 16 of the wiring board 12 and the aligned aperture of the circular conductive portion 17 are only slightly larger in diameter than the lead 15, but the aperture 26, with its rounded outer end of a given radius is of a definite size, larger than the lead 15 to bring about the desired reverse bend in each lead. If the diameter of the aperture 26 is larger than the apertures 16 in the wiring board the pin 22 has its upper portion of a diameter receivable freely in the aperture 16 to align the apertures 16 and 26. The size and contour of the aperture 26 of each anvil 18 is such that lateral movements of the anvils like distances toward each other during like known cushioning forces of the springs 20, result in the forming of reverse or double bends in the ends of the leads and creating like tensions or flexing actions in the leads above the bends to cause positioning and holding of like bends of the leads in close engagement with the adjacent conductive portions of the wiring board.

Figure 7:
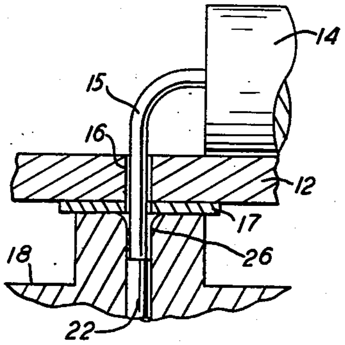
Figs. 7, 8 and 9 are fragmentary sectional views illustrating successive steps in clinching a lead.
Figure 9:
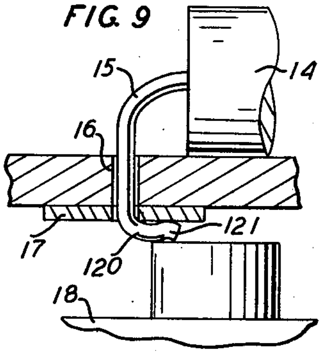
Figure 10:
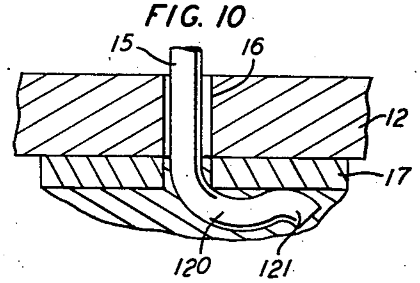
Fig. 10 is a fragmentary sectional view of the wiring board with a clinched lead soldered to its wire or conductor.

In following the motion of one anvil from the position shown in Fig. 7 to the position shown in Fig. 9, various forming steps take place. If the aperture 26 should be substantially equal in size to the lead 15 and there should be little or no curvature in the end of the aperture, the anvil would either shear off the end of the lead or pull the lead through the aperture 16 until it stretched beyond its elastic limit and broke. Under these conditions the cushioning force of the spring 20 could be a deciding factor as to whether or not the lead was sheared or broken. Therefore, by increasing the aperture 26 to a known size, rounding the outer edge thereof to a known radius and providing the cushioning means or spring 20 with a given force, the portion of the lead 15 in the aperture 26 is allowed to escape therefrom with sufficient friction to create a pull on the remaining portion of the lead, which, when coupled with the downward movement of the anvil 18 during forming of the bends 120 and 121 will flex the upper portion of the lead.

Figure 8:
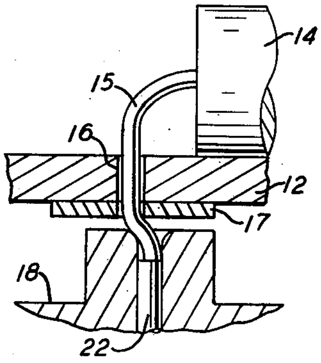
Figure 11:
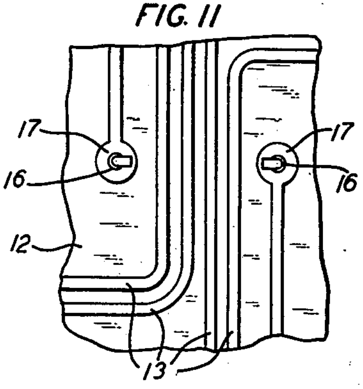
Fig. 11 is a fragmentary bottom plan view of the wiring board with the leads of a component clinched in place.

The anvil 18 is moved longitudinally or vertically downwardly at the beginning of the lateral or rocking motion. One bend 120 is being formed between the wiring board and the anvil while the trailing end lingers in the aperture 26, resulting in the reverse bend 121. This action is illustrated in Fig. 8. After the end of the lead, with the bend 121 completed and the bend 120 almost completed, leaves the aperture 26 the lower edge of the bend 121 rides on the upper surface of the anvil and the bend 120, thereby, is given its final form, forcing the outwardly curved portion of the bend 121 in close engagement with the conductive portion 17. At the completion of the clinching operations on the leads, the flexed leads will pull the formed or clinched ends upwardly to increase the efficiency of the contact between the ends of the leads and the conductive portions 17 of the wiring board. Furthermore, the movement of the anvils 18 like distances at like speeds toward each other serve to jointly hold the wiring board 12 against displacement during the clinching operations.

Reviewing the operation of the apparatus, let it first be considered that the apparatus is in desired adjustment for the components 14 to be mounted in the board 12. These adjustments include lateral positioning of the cylinders 47 for components of different widths and adjustments of certain switches to control timing of certain actions, depending on the diameters or widths of the components and whether or not they are to rest on the upper surface of the board. In most instances the components are disposed adjacent or upon the board. It is important for the numerous components to be mounted without damage thereto. To accomplish these results, rods 43—45 are actuated to clamp the leads 15 on the arms 53 at positions spaced from their connections with the components. These clamping actions on the leads prevent the stresses and tensions to which the leads are subjected during the cutting and bending operations, from reaching the lead-component connections. Furthermore, the forces, necessary to push the bent leads through the apertures 16 of the board, into the apertures of the clinching elements and to move the pins 21 and 22 (Fig. 1), sufficiently to operate switches 24 and 25, are applied adjacent the bends and vertical portions of the leads. These mechanical operations on the leads protect the components and their connections with their leads so that their efficient operating performances will be assured.

Another important feature in mounting components of different sizes is the means for freezing the down-travel of the rods 43—45 as soon as switches 24 and 25 close to energize relay 106 and valve 83. This action assures accurate clinching of desired lengths of the leads and prevents damage to the leads, the clinched portions and possibly their connections with the component if the rods 43—45 continued their down strokes after the clinching operation started.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. An apparatus for mounting electrical components, having leads extending in opposite directions from and connected to opposing ends thereof, on a board having spaced sets of apertures therein to receive the leads of selective components, the apparatus comprising units supported to rock about their axes and having apertures positioned eccentric with their axes and for alignment of a set of the apertures in the board therewith, means to move the leads of a component toward one surface of the board to move the leading ends of the leads through the apertures in the board and into their respective apertures of the units, and means actuable to rock the units to cause them to clinch the leading ends of the leads against the other surface of the board.

2. An apparatus for mounting electrical components, having leads extending in opposite directions from and connected to opposing ends thereof, on a board having spaced sets of apertures therein to receive the leads of selective components, the apparatus comprising units supported to rock about their axes and having apertures positioned eccentric with their axes and for alignment of a set of the apertures in the board therewith, means to move the leads of a component toward one surface of the board to move the leading ends of the leads through the apertures in the board and into their respective apertures of the units, means actuable to rock the units to cause them to clinch the leading ends of the leads against the other surface of the board and pins, adapted to be compressed by the leads disposed in the apertures of the units to enter the apertures of the board and thereby align the apertures of the board with the apertures of the units.

3. An apparatus for mounting electrical components, having leads extending in opposite directions from and connected to opposing ends thereof, on a board having spaced sets of apertures therein to receive the leads of selective articles, the apparatus comprising units supported to rock about their axes and having apertures positioned eccentric with their axes and for alignment of a set of the apertures in the board therewith, means to move the leads of a component toward one surface of the board to move the leading ends of the leads through the apertures in the board and into their respective apertures of the units, means actuable to rock the units to cause them to clinch the leading ends of the leads against the other surface of the board, and pins adapted to be compressed by the leads disposed in the apertures of the units to enter the apertures of the board and thereby align the apertures of the board with the apertures of the units, and means actuable by the compression of the pins by the leads entering the apertures of the units to cause actuation of the rocking means.

4. An apparatus for mounting electrical components, having leads of given diameters extending in opposite directions from and connected to opposing ends thereof, on a board having a set of spaced apertures therein to receive the leads of a component after they have been given substantially right angle bends to direct their leading end toward the apertures, the apparatus comprising anvils having lead receiving apertures therein larger in diameter than the leads, means operable to move the leading ends of the leads of a component through the apertures in the wiring board and into the apertures of the anvils, and means operable to move the anvils laterally relative to the apertures in the wiring board to cause the anvils to form reverse bends in the portions of the leads escaping from the apertures of the anvils during the lateral movement of the anvils, and causing one of the bends of each lead to closely engage the adjacent surface of the wiring board.

5. An apparatus for mounting electrical components, having leads of given diameters extending in opposite directions from and connected to opposing ends thereof, on a board having a set of spaced apertures therein to receive the leads of a component after they have been given substantially right angle bends to direct their leading end toward the apertures, the apparatus comprising anvils having lead receiving apertures therein larger in diameter than the leads, means operable to move the leading ends of the leads of a component through the apertures in the wiring board and into the apertures of the anvils, means operable to move the anvils laterally relative to the apertures in the wiring board to cause the anvils to form reverse bends in the portions of the leads escaping from the apertures of the anvils during the lateral movement of the anvils, and causing one of the bends of each lead to closely engage the adjacent surface of the wiring board, means to support the anvils for longitudinal movement, and cushioning means normally urging the anvils to given positions adjacent the wiring board and compressible by longitudinal movement of the anvils caused by the escapement of the leads therefrom.

6. An apparatus for mounting electrical components, having leads of given diameters extending in opposite directions from and connected to opposing ends thereof, on a board having a set of spaced apertures therein to receive the leads of a component after they have been given substantially right angle bends to direct their leading end toward the apertures, the apparatus comprising anvils having lead receiving and forming apertures therein larger in diameter than the leads and having outwardly flared ends, means operable to move the leading ends of the leads of a component through the apertures in the wiring board and into the apertures of the anvils, and means to move the anvils laterally to cause the anvils to form like bends in the leads, which extend away from the apertures in the wiring board and toward the undersurface of the wiring board, and at the same time form reverse directional bends in the ends of the leads and force them into engagement with the undersurface of the wiring board.

7. An apparatus for mounting electrical components, having leads of given diameters extending in opposite directions from and connected to opposing ends thereof, on a board having a set of spaced apertures therein to receive the leads of a component after they have been given substantially right angle bends to direct their leading end toward the apertures, the apparatus comprising anvils having lead receiving apertures therein larger in diameter than the leads, means operable to move the leading ends of the leads of a component through the apertures in the wiring board and into the apertures of the anvils, means operable to move the anvils laterally relative to the apertures in the wiring board to cause the anvils to form reverse bends in the portions of the leads escaping from the apertures of the anvils during the lateral movement of the anvils and causing one of the bends of each lead to closely engage the adjacent surface of the wiring board, the lateral movements of the anvils during forming of the bends in the leads creating like tensions in the leads to enhance the close engagement of the one bend of each lead with the surface of the wiring board.

8. An apparatus for mounting electrical components, having leads of given diameters extending in opposite directions from and connected to opposing ends thereof, on a board having a set of spaced apertures therein to receive the leads of a component after they have been given substantially right angle bends to direct their leading end toward the apertures, the apparatus comprising anvils having lead receiving apertures therein larger in diameter than the leads, means operable to move the leading ends of the leads of a component through the apertures in the wiring board and into the apertures of the anvils, pins, adapted to be depressed by the leads moving through the apertures of the board and into the apertures of the anvils, normally extending to positions above the anvils to align the apertures of the wiring board with the apertures of the anvils, and means operable to move the anvils laterally relative to the apertures in the wiring board to cause the anvils to form reverse bends in the portions of the leads escaping from the apertures of the anvils during the lateral movement of the anvils, and causing one of the bends of each lead to closely engage the adjacent surface of the wiring board.

9. An apparatus for mounting electrical components, having leads of given diameters extending in opposite directions from and connected to opposing ends thereof, on a board having a set of spaced apertures therein to receive the leads of a component after they have been given substantially right angle bends to direct their leading end toward the apertures, the apparatus comprising anvils having lead receiving apertures therein larger in diameter than the leads, means operable to move the leading ends of the leads of a component through the apertures in the wiring board and into the apertures of the anvils, pins, adapted to be depressed by the leads moving through the apertures of the board and into the apertures of the anvils, normally extending to positions above the anvils to align the apertures of the wiring board with the apertures of the anvils, means operable to move the anvils laterally relative to the apertures in the wiring board to cause the anvils to form reverse bends in the portions of the leads escaping from the apertures of the anvils during the lateral movement of the anvils, and causing one of the bends of each lead to closely engage the adjacent surface of the wiring board, and means actuable by the depressed pins to stop operation of the lead moving means.

10. An apparatus for mounting electrical components, having leads of given diameters extending in opposite directions from and connected to opposing ends thereof, on a board having a set of spaced apertures therein to receive the leads of a component after they have been given substantially right angle bends to direct their leading end toward the apertures, the apparatus comprising anvils having lead receiving apertures therein larger in diameter than the leads, means operable to move the leading ends of the leads of a component through the apertures in the wiring board and into the apertures of the anvils, pins, adapted to be depressed by the leads moving through the apertures of the board and into the apertures of the anvils, normally extending to positions above the anvils to align the apertures of the wiring board with the apertures of the anvils, means operable to move the anvils laterally relative to the apertures in the wiring board to cause the anvils to form reverse bends in the portions of the leads escaping from the apertures of the anvils during the lateral movement of the anvils, and causing one of the bends of each lead to closely engage the adjacent surface of the wiring board, means actuable by the depressed pins to stop operation of the lead moving means, and means actuable by the depression of the pins to cause operation of the anvil moving means.

11. In an apparatus for clinching the leads projecting from electrical components and extending through apertures and protruding from a surface of a wiring board, a pair of clinching anvils having bores larger than the leads and with outwardly flared ends to respectively receive end portions of the leads, means to cushion the anvils for longitudinal movements against predetermined like forces, and means to cause lateral movement of the anvils to cause forming of reverse bends in the end portions of the leads as they leave the bores of the units.

12. In an apparatus for clinching the leads projecting from electrical components and extending through apertures and protruding from a surface of a wiring board, a pair of clinching anvils having bores larger than the leads and with outwardly flared ends to respectively receive end portions of the leads, means to cushion the anvils for longitudinal movements against predetermined like forces, and means to cause lateral movement of the anvils to cause forming of reverse bends in the end portions of the leads as they leave the bores of the units and to thereby cause flexing of the leads between the end portions and the components to assist in closely positioning the clinched end portions of the lead in engagement with the surface of the wiring board.

13. In an apparatus for clinching the leads of electrical components extending through apertures in and protruding from the surface of a wiring board, a pair of clinching units each having a bore and a pin in the bore, means for resiliently supporting the pin for engagement with an aperture in the board to locate the board with respect to the units, and means responsive to movement of the pins against the resilient supporting means by the leads entering the bores of the units to move the units laterally to clinch the leads.

No references cited.